(12) United States Patent
Horii

(10) Patent No.: US 11,477,909 B2
(45) Date of Patent: Oct. 18, 2022

(54) ATTACHMENT MEMBER, MEMBER ATTACHMENT STRUCTURE, AND MEMBER ATTACHMENT METHOD

(71) Applicant: NEC Platforms, Ltd., Kawasaki (JP)

(72) Inventor: Yuji Horii, Kanagawa (JP)

(73) Assignee: NEC Platforms, Ltd., Kanagawa (JP)

( * ) Notice: Subject to any disclaimer, the term of this patent is extended or adjusted under 35 U.S.C. 154(b) by 0 days.

(21) Appl. No.: 17/288,659

(22) PCT Filed: Nov. 1, 2019

(86) PCT No.: PCT/JP2019/043129
§ 371 (c)(1),
(2) Date: Apr. 26, 2021

(87) PCT Pub. No.: WO2020/095853
PCT Pub. Date: May 14, 2020

(65) Prior Publication Data
US 2021/0400835 A1 Dec. 23, 2021

(30) Foreign Application Priority Data
Nov. 6, 2018 (JP) .............................. JP2018-208863

(51) Int. Cl.
*H05K 7/18* (2006.01)
*H05K 7/14* (2006.01)

(52) U.S. Cl.
CPC ........... *H05K 7/183* (2013.01); *H05K 7/1489* (2013.01)

(58) Field of Classification Search
CPC ...... H05K 7/183; H05K 7/1489; A47B 96/07; A47B 57/32; A47B 96/1408
See application file for complete search history.

(56) References Cited

U.S. PATENT DOCUMENTS

| | | | | |
|---|---|---|---|---|
| 7,699,279 B2* | 4/2010 | Chen | ...................... | A47B 88/43 248/220.41 |
| 7,857,145 B2* | 12/2010 | Mushan | ................. | A47B 88/43 211/26 |
| 8,104,626 B2* | 1/2012 | Huang | ................. | H05K 7/1489 211/26 |

(Continued)

FOREIGN PATENT DOCUMENTS

| | | |
|---|---|---|
| JP | 2006-202792 A | 8/2006 |
| JP | 3155796 U | 12/2009 |

(Continued)

OTHER PUBLICATIONS

International Search Report for PCT Application No. PCT/JP2G19/043129. dated Nov. 26, 2019.

*Primary Examiner* — Ko H Chan

(57) ABSTRACT

What is provided is an attachment member that can be respectively attached to target members of different types, the member including a member main body, a first protrusion which is provided at an end portion of the member main body and is engageable with a first engaged part formed on a first target member, a second protrusion which is provided at the end portion of the member main body and is engageable with a second engaged part formed on a second target member, and an advancement and retraction mechanism which is configured to cause the second protrusion to advance and retract from the end portion of the member main body.

10 Claims, 17 Drawing Sheets

(56) References Cited

U.S. PATENT DOCUMENTS

| | | | |
|---|---|---|---|
| 8,727,138 B2* | 5/2014 | Dittus | H05K 7/1489 |
| | | | 211/26 |
| 9,125,489 B2* | 9/2015 | Chen | A47B 88/43 |
| 9,844,162 B2* | 12/2017 | Tang | A47B 88/43 |
| 10,064,306 B2* | 8/2018 | Huang | H05K 7/1489 |
| 10,398,226 B2* | 9/2019 | Chen | A47B 88/43 |
| 10,925,392 B2* | 2/2021 | Chen | A47B 57/36 |
| 2006/0157436 A1 | 7/2006 | Iwamoto | |
| 2008/0067907 A1 | 3/2008 | Chen et al. | |
| 2009/0167127 A1* | 7/2009 | Chen | A47B 88/43 |
| | | | 312/334.1 |
| 2010/0072153 A1 | 3/2010 | Chen et al. | |
| 2013/0056432 A1* | 3/2013 | Lin | A47B 88/43 |
| | | | 211/123 |
| 2014/0117180 A1* | 5/2014 | Chen | H05K 7/1489 |
| | | | 248/219.1 |
| 2017/0196354 A1 | 7/2017 | Chen et al. | |
| 2017/0215585 A1* | 8/2017 | Chen | H05K 7/1489 |

FOREIGN PATENT DOCUMENTS

| | | |
|---|---|---|
| JP | 2017-124155 A | 7/2017 |
| JP | 2017-131632 A | 8/2017 |

* cited by examiner

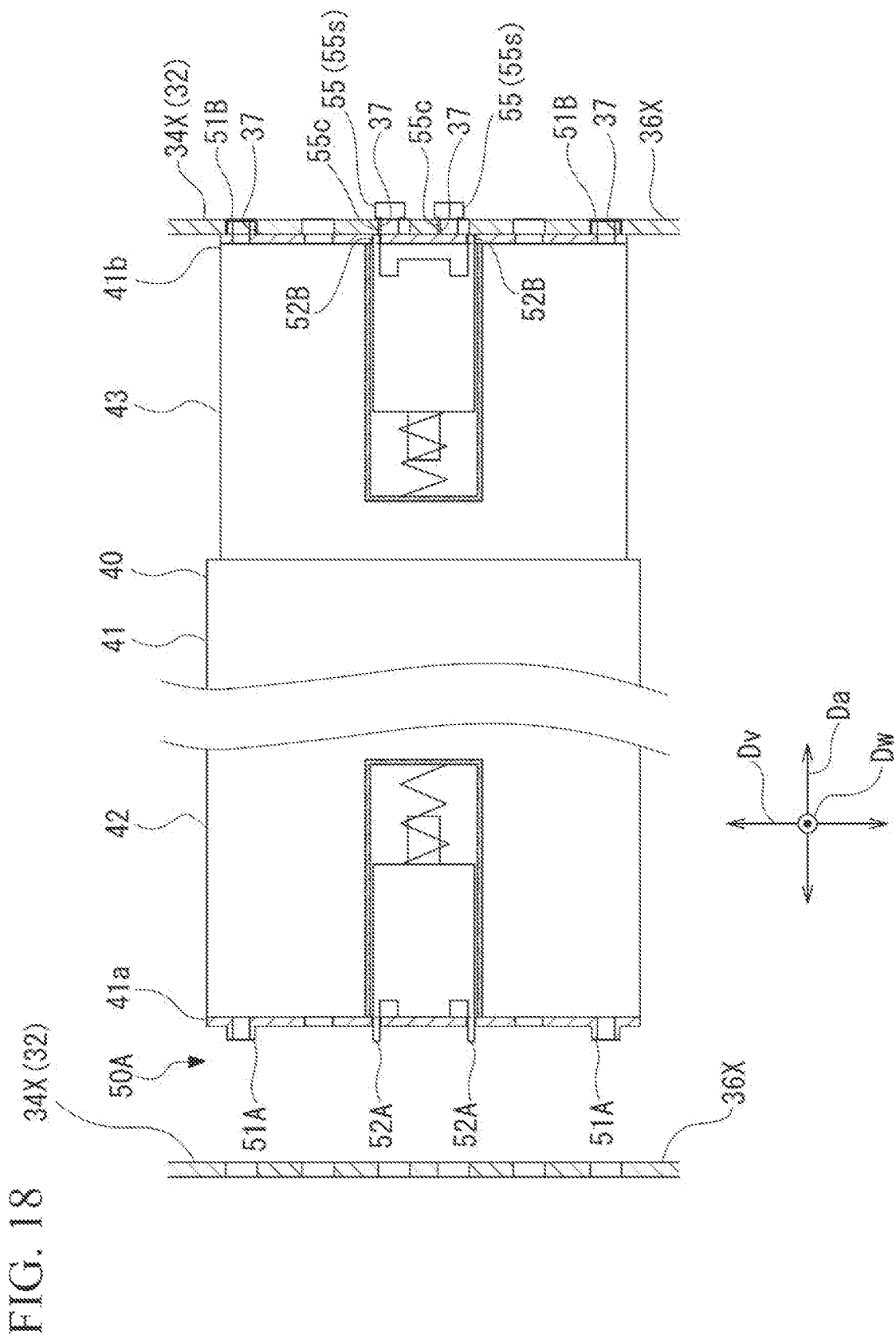

ATTACHMENT MEMBER, MEMBER ATTACHMENT STRUCTURE, AND MEMBER ATTACHMENT METHOD

This application is a National Stage Entry of PCT/JP2019/043129 filed on Nov. 1, 2019, which claims priority from Japanese Patent Application 2018-208863 filed on Nov. 6, 2018, the contents of all of which are incorporated herein by reference, in their entirety.

TECHNICAL FIELD

The present invention relates to an attachment member, a member attachment structure, and a member attachment method.

BACKGROUND ART

Racks are used to mount various electronic devices such as computer devices. Patent Document 1 discloses a rack including a rack frame and a support rail for supporting a device to be mounted. This rack includes a plurality of positioning protrusions (square protrusions and round protrusions) at a fixing part for fixing the support rail to the rack frame. When a plurality of positioning protrusions are provided, it is possible to fit to each of positioning holes provided in different types of rack frames. Accordingly, one support rail can be fixed to rack frames having different positioning holes, and thus the versatility of the support rail can be increased.

CITATION LIST

Patent Literature

[Patent Document 1]
Japanese Unexamined Patent Application, First Publication No. 2006-202792

SUMMARY OF THE INVENTION

Problems to be Solved by the Invention

However, in the configuration disclosed in Patent Document 1, among the plurality of positioning protrusions, the protrusions corresponding to positioning holes provided in the rack frame can be fitted into these positioning holes. At this time, when the other protrusions which do not correspond to the positioning holes of the rack frame are larger than the positioning holes, the other protrusions cannot be received in the positioning holes. Then, since the other protrusions come into contact with the rack frame, a gap is formed between an end portion of the support rail and the rack frame. Therefore, the connection strength between the support rail and the rack frame is lower than that when the end portion of the support rail and the rack frame are brought into close contact with each other. Such a problem is not limited to a support rail and a rack frame and is common to cases in which various members are attached to a target member. That is, when one of a plurality of protrusions provided on a member is engaged with an engaged part of a target member, and other protrusions interfere with engaged parts, the strength of attachment of the member to the target member may be lowered.

An example object of the present invention is to provide an attachment member, a member attachment structure, and a member attachment method which solve the above-described problem in which the strength of attachment of a member to a target member is lowered.

Means for Solving the Problems

According to a first aspect of the present invention, an attachment member which is attachable to target members of different types, including a member main body, a first protrusion which is provided on an end portion of the member main body and is engageable with a first engaged part formed on a first target member, a second protrusion which is provided on the end portion of the member main body and is engageable with a second engaged part formed on a second target member, and an advancement and retraction mechanism which is configured to cause the second protrusion to advance and retract from the end portion of the member main body.

According to a second aspect of the present invention, a member attachment structure to a member that is target, the member including a member main body, a first protrusion which is provided at an end portion of the member main body, a second protrusion which is provided at the end portion of the member main body, and an advancement and retraction mechanism which is configured to cause the second protrusion to advance and retract from the end portion of the member main body. The first protrusion is engaged with an engaged part formed on the member that is target, the second protrusion is retracted inside the end portion of the member main body by the advancement and retraction mechanism, and the end portion of the member main body around the second protrusion is brought into contact with the member that is target.

According to a third aspect of the present invention, a member attachment method to a target member, including an engagement step of engaging a first protrusion provided at an end portion of a member main body of a member with an engaged part formed on the target member, causing a second protrusion provided to be advanceable and retractable from the end portion of the member main body to retract inside the end portion, and bringing the end portion of the member main body around the second protrusion into contact with the target member, and a connection step of connecting the end portion of the member main body to the target member.

Advantageous Effects of Invention

According to the attachment member, the member attachment structure, and the member attachment method of the present invention, it is possible to curb a decrease in strength of attachment of a member to a target member.

BRIEF DESCRIPTION OF THE DRAWINGS

FIG. 18 is a side cross-sectional view showing a state in which the second end portion of the rack rail is temporarily locked in the member attachment method according to the present embodiment.

EXAMPLE EMBODIMENT

A plurality of embodiments of the present invention will be described below with reference to the drawings. However, for the same parts as those of the above-described conventional example regarding this embodiment, the same names are used, and a detailed description thereof will be omitted.

First Embodiment

Figure 1:
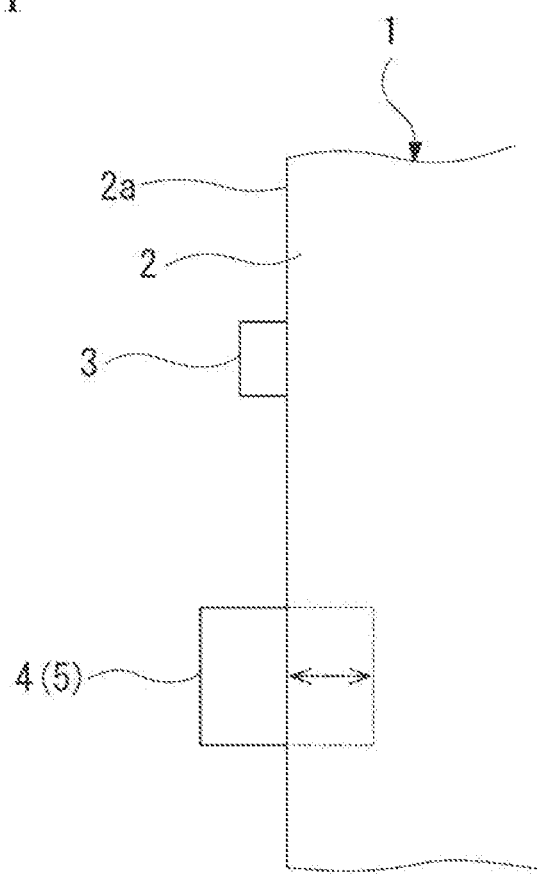
FIG. 1 is a diagram showing a minimum configuration of an attachment member according to the present embodiment.
Figure 2:
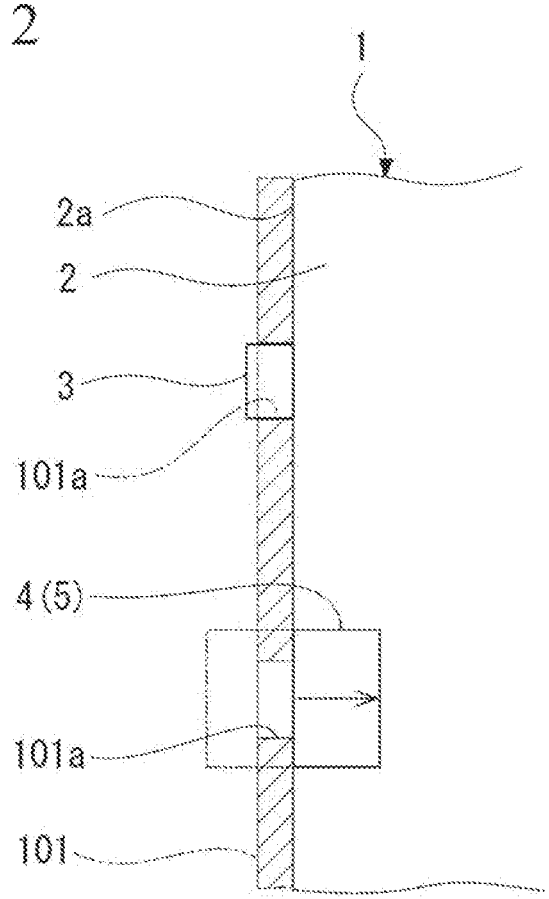
FIG. 2 is a diagram showing a configuration when the attachment member according to the present embodiment is attached to a first target member.
Figure 3:
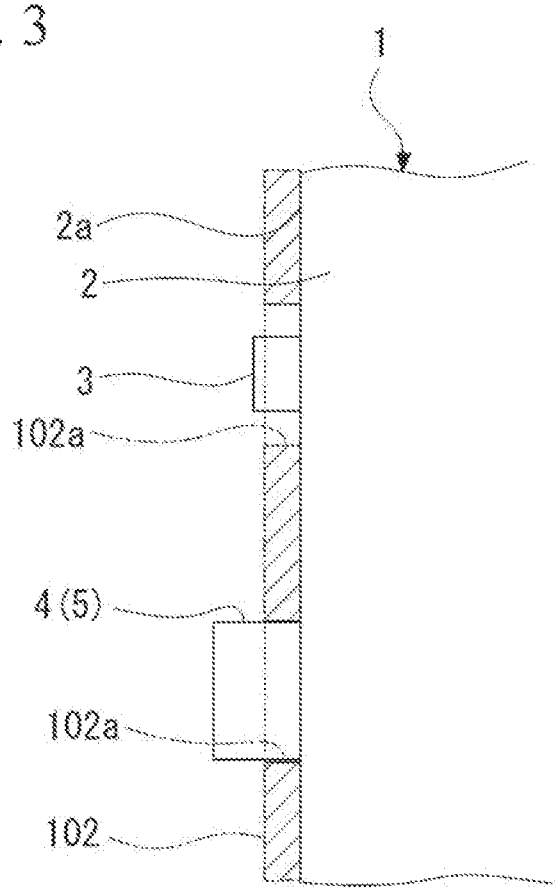
FIG. 3 is a diagram showing a configuration when the attachment member according to the present embodiment is attached to a second target member.

FIG. 1 is a diagram showing a minimum configuration of an attachment member according to the present embodiment. FIG. 2 is a diagram showing a configuration when the attachment member according to the present embodiment is attached to a first target member. FIG. 3 is a diagram showing a configuration when the attachment member according to the present embodiment is attached to a second target member.

As shown in FIG. 1, an attachment member 1 may include at least a member main body 2, a first protrusion 3, a second protrusion 4, and an advancement and retraction mechanism 5.

As shown in FIGS. 2 and 3, the attachment member 1 can be attached to each of target members 101 and 102 of different types. The configuration of the target members 101 and 102 is not limited at all. The first target member 101 includes a first engaged part 101*a*. The second target member 102 includes a second engaged part 102*a*. The first engaged part 101*a* and the second engaged part 102*a* are different from each other. The first engaged part 101*a* and the second engaged part 102*a* may be different in shape, size, and the like.

As shown in FIG. 1, the member main body 2 includes the first protrusion 3 and the second protrusion 4 at an end portion 2*a* thereof. A configuration of the member main body 2 is not limited at all and may be any one such as various devices, a support member which supports a device, and a bracket which attaches the support member to the target members 101 and 102.

As shown in FIGS. 1 and 2, the first protrusion 3 is provided on the end portion 2*a* of the member main body 2. The first protrusion 3 can be engaged with the first engaged part 101*a* formed in the first target member 101.

As shown in FIGS. 1 and 3, the second protrusion 4 is provided on the end portion 2*a* of the member main body 2. The second protrusion 4 can be engaged with the second engaged part 102*a* formed in the second target member 102.

The advancement and retraction mechanism 5 causes the second protrusion 4 to advance and retract from the end portion 2*a* of the member main body 2.

As shown in FIG. 2, when the attachment member 1 is attached to the first target member 101, the first protrusion 3 is engaged with the first engaged part 101*a*. When the second protrusion 4 interferes with the first target member 101 in a state in which the first protrusion 3 is engaged with the first engaged part 101*a* and the attachment member 1 is attached to the first target member 101, the advancement and retraction mechanism 5 does not cause the second protrusion 4 to protrude from the end portion 2*a*, but retracts it inside the end portion 2*a*. Thus, it is possible to curb interference of the second protrusion 4 with the first target member 101. Therefore, when the first protrusion 3 is engaged with the first engaged part 101*a* and the attachment member 1 is attached to the first target member 101, it is possible to curb formation of a gap between the end portion 2*a* of the member main body 2 and the first target member 101. As a result, the end portion 2*a* of the member main body 2 and the first target member 101 can be brought into close contact with each other to increase the strength of attachment of the attachment member 1 to the first target member 101.

As shown in FIG. 3, when the attachment member 1 is attached to the second target member 102, the second protrusion 4 is engaged with the second engaged part 102*a*. In this state, the first protrusion 3 may be engaged with the second engaged part 102*a*. Further, the first protrusion 3 may include the same advancement and retraction mechanism as that of the second protrusion 4, and the first protrusion 3 may be retracted inside the end portion 2*a*.

In the above-described embodiment, the first protrusion 3, the second protrusion 4, the first engaged part 101*a*, and the second engaged part 102*a* are not limited in shape, arrangement, number of installations, and the like. The first protrusion 3 and the first engaged part 101a, and the second protrusion 4 and the second engaged part 102a may be respectively engageable with each other.

Further, in the above-described embodiment, the advancement and retraction mechanism 5 is not limited in specific configuration thereof as long as the second protrusion 4 can advance and retract from the end portion 2a.

Further, in the above-described embodiment, the attachment member 1, the first target member 101, and the second target member 102 may be joined to each other by joining units such as bolts, welding, and adhesion.

Second Embodiment

Figure 4:
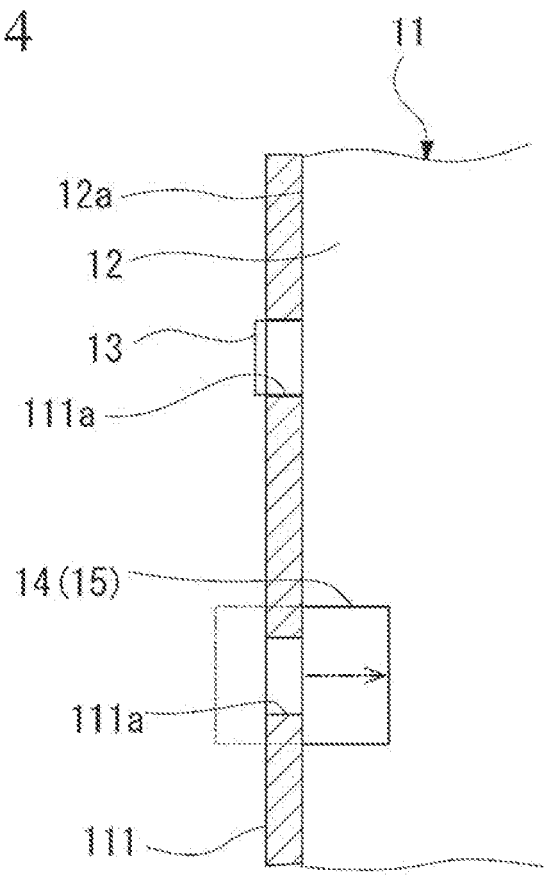
FIG. 4 is a diagram showing a minimum configuration of a member attachment structure according to the present embodiment.

FIG. 4 is a diagram showing a minimum configuration of a member attachment structure according to the present embodiment.

As shown in this drawing, an attachment structure of a member 11 may have at least a configuration in which a first protrusion 13 is engaged with an engaged part 111a formed on a target member 111, and a second protrusion 14 retracts inside an end portion 12a of the member main body 12 by an advancement and retraction mechanism 15.

The member 11 includes the member main body 12, the first protrusion 13, the second protrusion 14, and the advancement and retraction mechanism 15.

The member main body 12 has the first protrusion 13 and the second protrusion 14 at the end portion 12a thereof. The configuration of the member main body 12 is not limited at all and may be various types of devices, a support member which supports the device, a bracket which attaches the support member to the target member 111, and the like.

The first protrusion 13 is provided on the end portion 12a of the member main body 12.

The second protrusion 14 is provided on the end portion 12a of the member main body 12.

The advancement and retraction mechanism 15 causes the second protrusion 14 to advance and retract from the end portion 12a of the member main body 12.

In the member 11, the first protrusion 13 is engaged with the engaged part 111a formed on the target member 111. Further, the second protrusion 14 does not protrude from the end portion 12a due to the advancement and retraction mechanism 15, and is retracted inside the end portion 12a of the member main body 12. Regarding the member 11, the end portion 12a of the member main body 12 around the second protrusion 14 comes into contact with the target member 111.

In the attachment structure of the member 11, the member 11 is attached to the target member 111 by engaging the first protrusion 13 with the engaged part 111a. In this state, the advancement and retraction mechanism 15 does not cause the second protrusion 14 to protrude from the end portion 12a and retracts it inside the end portion 12a. Thus, it is possible to curb interference of the second protrusion 14 with the target member 111. Therefore, it is possible to curb the formation of a gap between the end portion 12a of the member main body 12 and the target member 111. As a result, the end portion 12a of the member main body 12 and the target member 111 can be brought into close contact with each other to increase the strength of attachment of the member 11 to the target member 111.

Further, the member 11 may be attached to another target member (not shown) using the second protrusion 14. In that case, regarding the member 11, the second protrusion 14 is engaged with another engaged part (not shown) provided on the other target member.

In this state, the first protrusion 13 may be engaged with another engaged part. Further, the first protrusion 13 may include the same advancement and retraction mechanism as that of the second protrusion 14, and the first protrusion 13 may be retracted inside the end portion 12a.

In the above-described embodiment, the first protrusion 13, the second protrusion 14, and the engaged part 111a are not limited in shape, arrangement, number of installations, and the like. The first protrusion 13 and the engaged part 111a may be engageable with each other.

Further, in the above-described embodiment, the advancement and retraction mechanism 15 is not limited in specific configuration as long as the second protrusion 14 may advance and retract from the end portion 12a.

Third Embodiment

Figure 5:
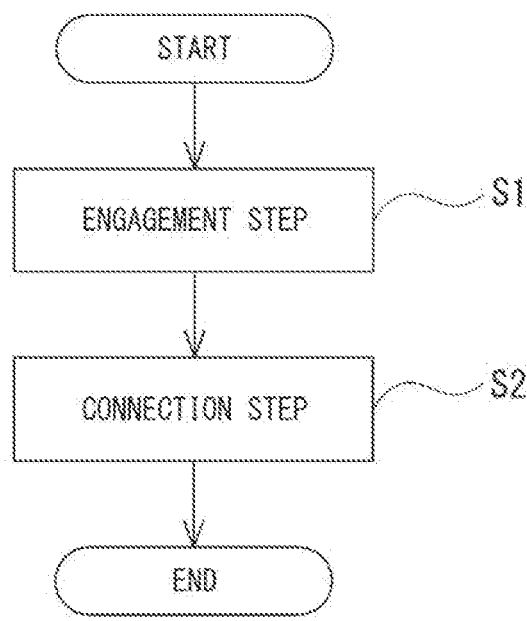
FIG. 5 is a diagram showing a minimum configuration of a member attachment method according to the present embodiment.
Figure 6:
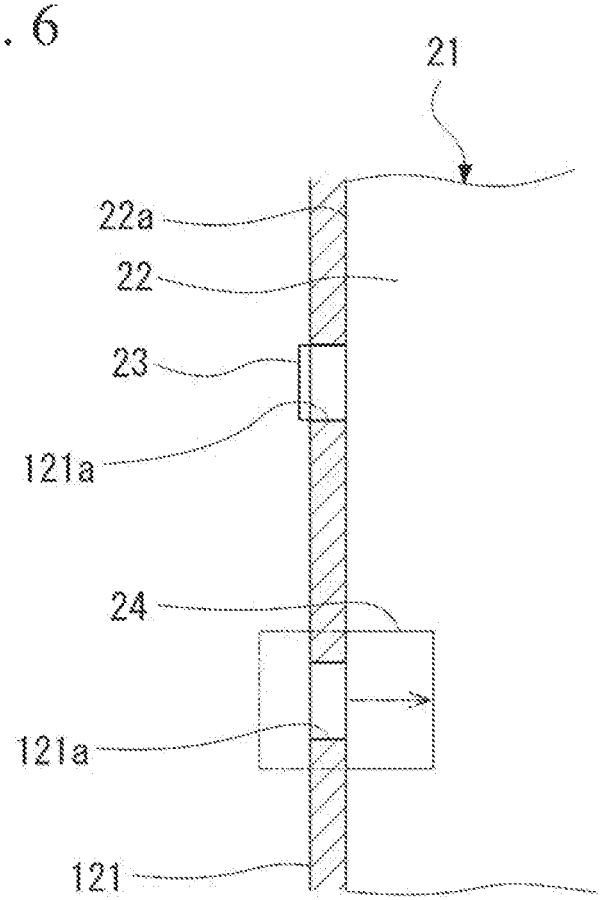
FIG. 6 is a diagram showing a locked state between a member main body and a target member in a locking step of the member attachment method according to the present embodiment.

FIG. 5 is a diagram showing a minimum configuration of a member attachment method according to the present embodiment. FIG. 6 is a diagram showing a locked state between the member main body and the target member in a locking step of the member attachment method according to the present embodiment.

As shown in this drawing, the attachment method of a member 21 may include at least the following engagement step S1 and connection step S2.

As shown in FIG. 6, in the engagement step S1, a first protrusion 23 provided on an end portion 22a of a member main body 22 of a member 21 is engaged with an engaged part 121a formed on a target member 121. Further, in the engagement step S1, a second protrusion 24 provided to be advanceable and retractable from the end portion 22a of the member main body 22 is retracted inside the end portion 22a. Further, in the engagement step S1, the end portion 22a of the member main body 22 around the second protrusion 24 comes into contact with the target member 121.

In the connection step S2, the end portion 22a of the member main body 22 and the target member 121 are connected to each other.

In an attachment method of the member 21, the first protrusion 23 is engaged with the engaged part 121a to attach the member 21 to the target member 121. In this state, the second protrusion 24 is retracted inside the end portion 22a without protruding from the end portion 22a. Thus, it is possible to curb interference of the second protrusion 24 with the target member 121. Therefore, it is possible to curb the formation of a gap between the end portion 22a of the member main body 22 and the target member 121. As a result, the end portion 22a of the member main body 22 and the target member 121 can be brought into close contact with each other, and the strength of attachment of the member 21 to the target member 121 can be increased.

In the above-described embodiment, the configuration of the member main body 22 is not limited at all and may be any device, a support member which supports a device, a bracket which attaches the support member to the target member 121, and the like.

In the above-described embodiment, the first protrusion 23 and the second protrusion 24 are not limited in shape, arrangement, number of installations, and the like. The first protrusion 23 and the engaged part 121a may be engageable with each other.

In the above-described embodiment, as long as the second protrusion 24 can advance and retract from the end portion 22a, the specific configuration thereof is not limited at all.

Fourth Embodiment

Figure 7:
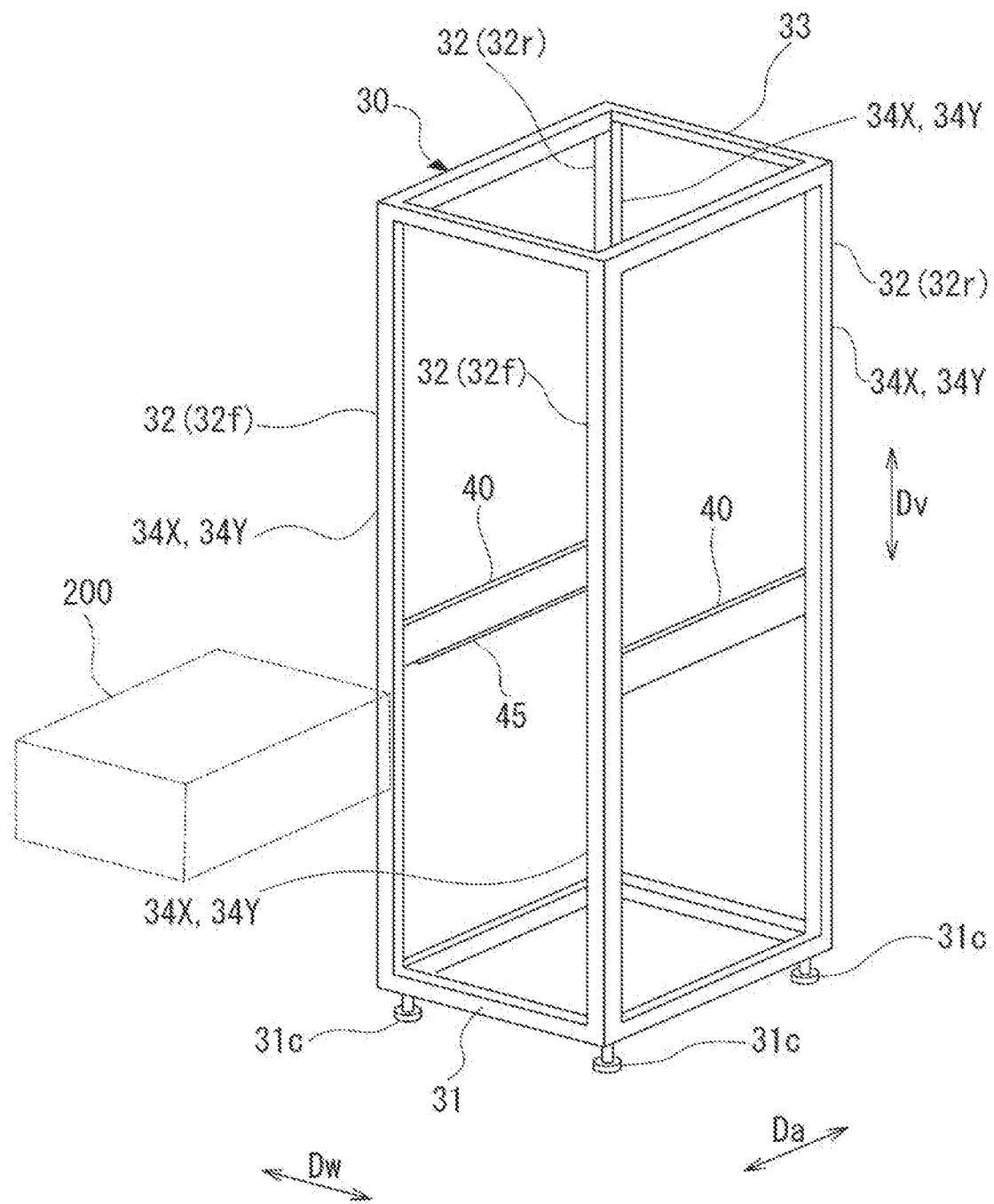
FIG. 7 is a perspective view showing a schematic configuration of a rack server to which the attachment member and the member attachment structure according to the present embodiment are applied.

FIG. 7 is a perspective view showing a schematic configuration, according to the present embodiment, of the attachment member and a rack server to which the member attachment structure are applied.

As shown in this drawing, a rack rail 40 is attached to a server rack 30.

The server rack 30 accommodates box-shaped server devices 200 stacked in a plurality of stages in a vertical direction. The server rack 30 includes a lower frame 31, a rack strut 32, and an upper frame 33.

The lower frame 31 has a rectangular shape in a plan view and is disposed parallel to a floor surface. In the present embodiment, the lower frame 31 has a rectangular shape in a plan view. In the following description, a longitudinal direction of the lower frame 31 is referred to as a forward and rearward direction Da, and a transverse direction of the lower frame 31 is referred to as a width direction Dw. Further, a direction orthogonal to the forward and rearward direction Da and the width direction Dw is referred to as a vertical direction Dv.

The lower frame 31 has adjusters 31c at four corners of a lower surface thereof. A lower end of the adjuster 31c is grounded to the floor surface. The adjuster 31c has an adjustable protrusion dimension from the lower surface of the lower frame 31 downward. Installation levelness of the server rack 30 is adjusted by adjusting the protrusion dimensions of the adjusters 31c at the four corners.

The rack struts 32 are disposed at the four corners of the lower frame 31. Each of the rack struts 32 extends upward from the lower frame 31 in the vertical direction Dv.

The upper frame 33 is supported on a plurality of rack struts 32. The upper frame 33 has a rectangular shape in a plan view and is disposed parallel to the lower frame 31.

The rack rails 40 are provided on both sides of the server rack 30 in the width direction Dw. Each of the rack rails 40 extends in the forward and rearward direction Da and is attached between the rack strut 32f on one side in the forward and rearward direction Da and the rack strut 32r on the other side in the forward and rearward direction Da.

The rack rails 40 on both sides in the width direction Dw are provided at the same height in the vertical direction Dv.

Figure 8:
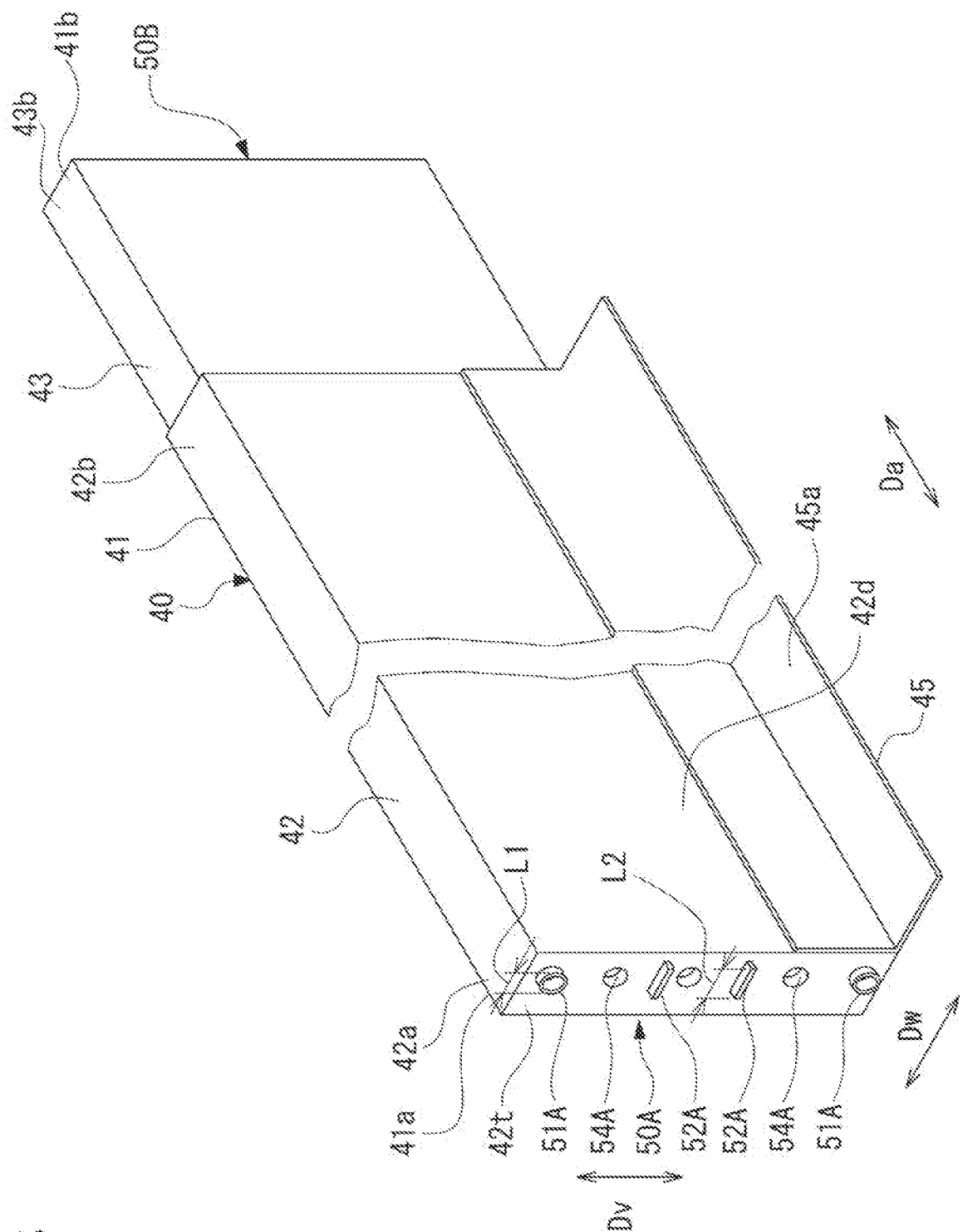
FIG. 8 is a perspective view of a rack rail which is the attachment member according to the present embodiment when seen from a first end portion side.
Figure 9:
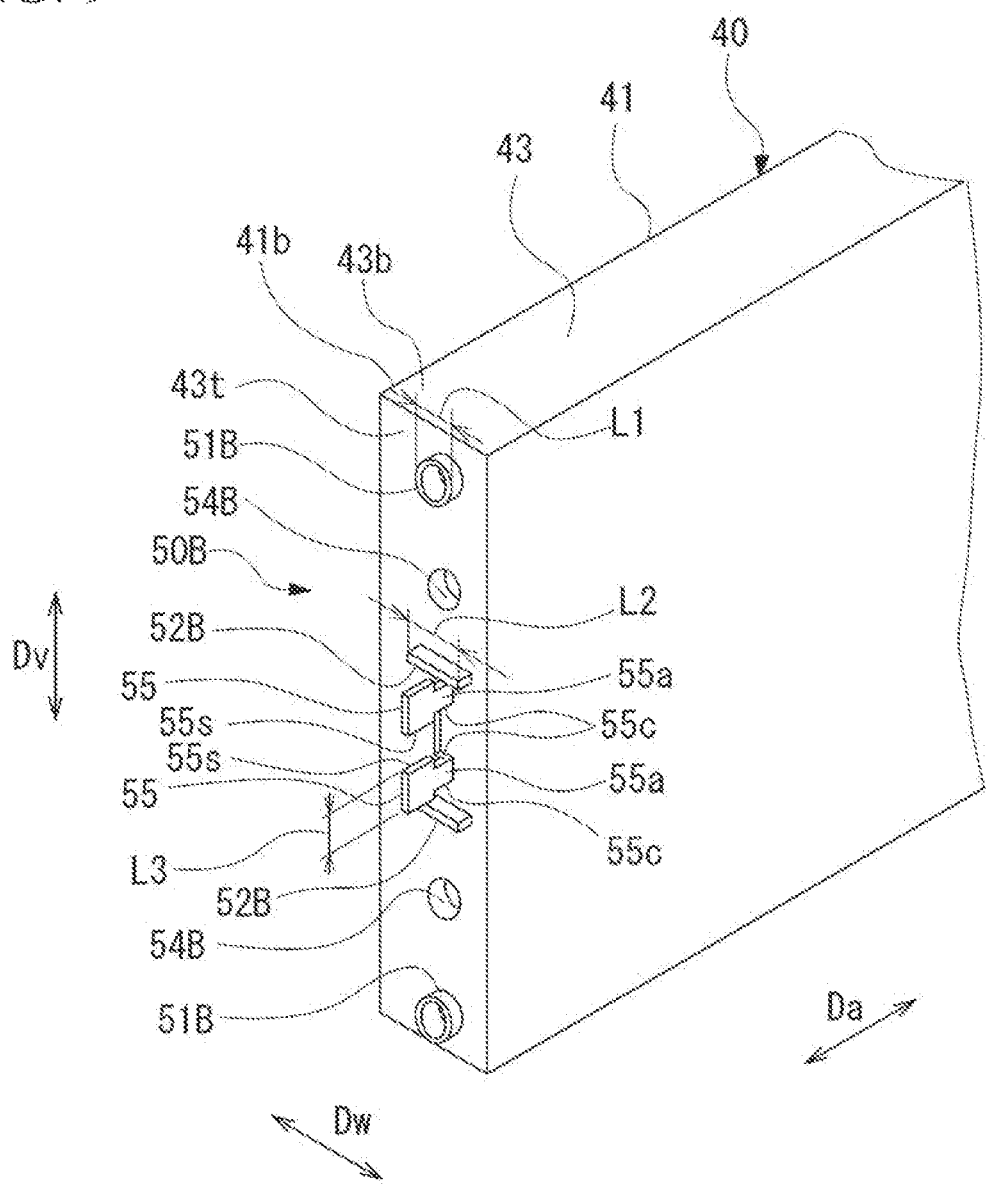
FIG. 9 is a perspective view of the rack rail which is the attachment member according to the present embodiment when seen from a second end portion side.

FIG. 8 is a perspective view of the rack rail which is the attachment member according to the present embodiment when seen from first end portion side. FIG. 9 is a perspective view of the rack rail which is the attachment member according to the present embodiment when seen from the second end portion side.

Hereinafter, the rack rail 40 which can be attached to the rack strut 32 will be described.

As shown in FIGS. 8 and 9, the rack rail (the attachment member, the member) 40 includes a rail main body (the member main body) 41, a first fixing part 50A, and a second fixing part 50B.

As shown in FIG. 8, the rail main body 41 includes an outer rail 42 and an inner rail 43. The outer rail 42 has a rectangular shape or a C shape of which a cross-sectional shape seen in the forward and rearward direction Da is long in the vertical direction Dv, and extends continuously in the forward and rearward direction Da. The outer rail 42 includes an end plate 42t orthogonal to the forward and rearward direction Da at a first end portion 42a thereof in the forward and rearward direction Da.

Further, the outer rail 42 includes a support bracket 45 on a side surface 42d of the server rack 30 which faces inward in the width direction Dw. The support bracket 45 has a support plate part 45a which has an L-shaped cross section seen in the forward and rearward direction Da and protrudes inward from the side surface 42d of the server rack 30 in the width direction Dw. Both end portions of a server device 200 or the like in the width direction Dw are placed on the support plate parts 45a provided on both sides in the width direction Dw.

The inner rail 43 has a rectangular shape or a C shape of which a cross-sectional shape seen in the forward and rearward direction Da is long in the vertical direction Dv, and extends continuously in the forward and rearward direction Da. The inner rail 43 is inserted inside the outer rail 42 from a second end portion 42b of the outer rail 42 in the forward and rearward direction Da. The inner rail 43 is slidable inside the outer rail 42 in the forward and rearward direction Da. The length of the rail main body 41 in the forward and rearward direction Da can be adjusted by the inner rail 43 sliding to advance and retract from the inside of the end portion 42b of the outer rail 42 in the forward and rearward direction Da.

Further, as shown in FIG. 9, the inner rail 43 includes an end plate 43t orthogonal to the forward and rearward direction Da at the second end portion 43b thereof in the forward and rearward direction Da.

As shown in FIG. 8, the rail main body 41 includes a first fixing part 50A at a first end portion (an end portion) 41a on one side in the forward and rearward direction Da. The first fixing part 50A is provided on the end plate 42t of the outer rail 42. The first fixing part 50A includes a round protrusion (the first protrusion) 51A, a square protrusion (the second protrusion) 52A, an advancement and retraction mechanism 53A (refer to FIG. 10), and a screw hole 54A.

The round protrusion 51A has a circular shape when seen in the forward and rearward direction Da, and protrudes in a direction orthogonal to the end plate 42t. A pair of round protrusions 51A are provided at both end portions of the end plate 42t in the vertical direction Dv.

The square protrusion 52A has a rectangular shape having a long side in the width direction Dw when seen in the forward and rearward direction Da. The width dimension (an external dimension) L2 of the square protrusion 52A in the width direction Dw is larger than the diameter (an external dimension) L1 of the round protrusion 51A in a direction orthogonal to the forward and rearward direction Da. In other words, the round protrusion 51A has a smaller external dimension than that of the square protrusion 52A in the direction orthogonal to the forward and rearward direction Da which connects the first end portion 41a and a second end portion (an end portion) 41b of the rail main body 41. Further, the round protrusion 51A and the square protrusion 52A have different shapes when seen in the forward and rearward direction Da.

A pair of such square protrusions 52A are provided at an interval in the vertical direction Dv of the end plate 42t. The pair of square protrusions 52A are disposed between the pair of round protrusions 51A.

The screw hole 54A is formed to pass through the end plate 42t of the outer rail 42 in the forward and rearward direction Da. A female screw groove is formed in an inner circumferential surface of the screw hole 54A.

The round protrusion 51A, the square protrusion 52A, and the screw hole 54A are linearly disposed in the vertical direction Dv.

Figure 10:
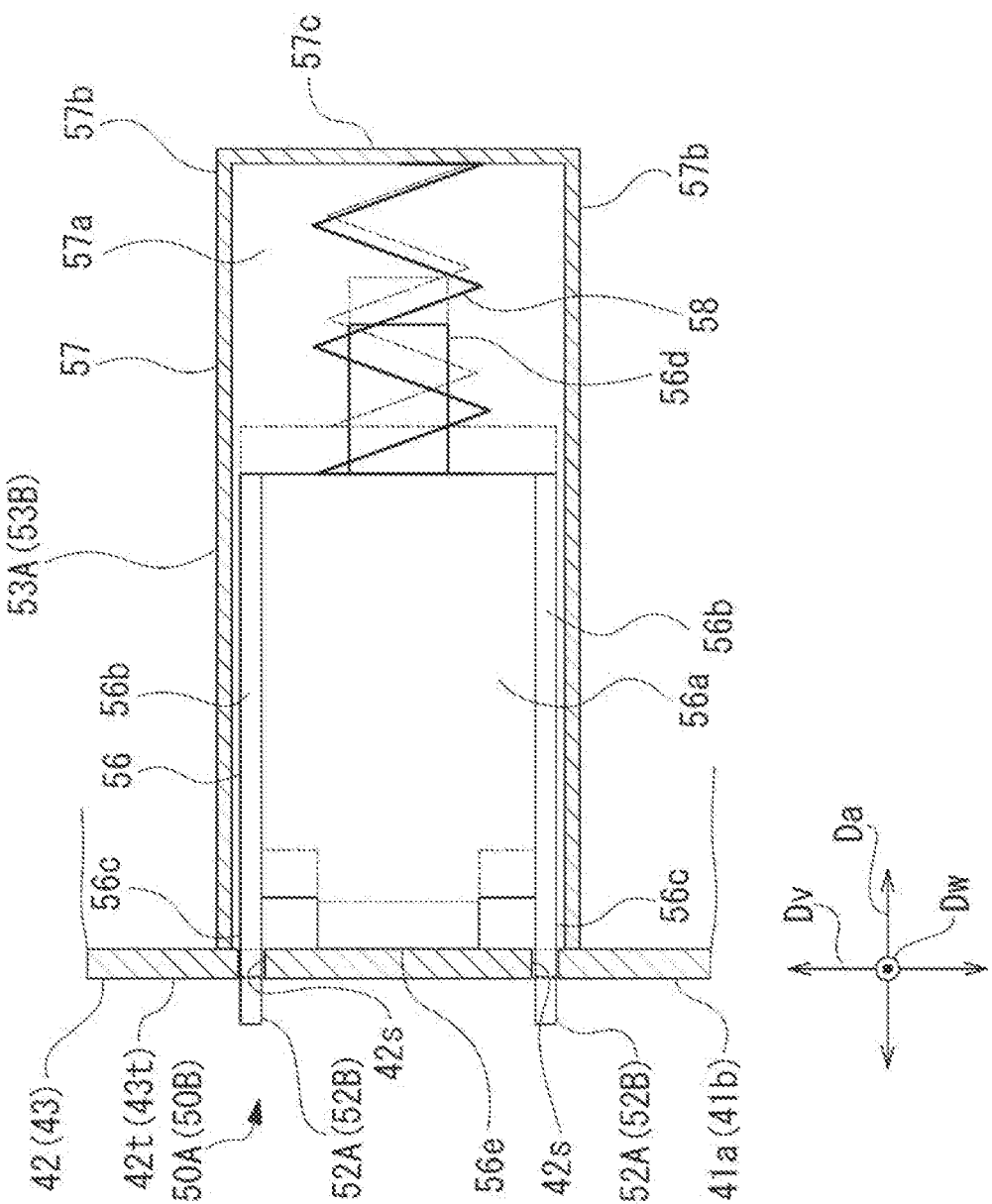
FIG. 10 is a cross-sectional view showing an advancement and retraction mechanism of the attachment member according to the present embodiment.

FIG. 10 is a cross-sectional view showing the advancement and retraction mechanism of the attachment member according to the present embodiment.

As shown in FIG. 10, the advancement and retraction mechanism 53A causes the square protrusion 52A to advance and retract from the first end portion 41a of the rail main body 41. The advancement and retraction mechanism 53A includes a protrusion member 56, a holding bracket (a holding member) 57, and a biasing spring (a biasing member) 58.

The protrusion member 56 forms the square protrusion 52A. The protrusion member 56 includes a base part 56a, a pair of wall parts 56b, a claw part 56c, a spring insertion part 56d, and a stopper part 56e. The protrusion member 56 is formed by bending a metal plate into a predetermined shape by press working.

The base part 56a has a plate shape and is located in a plane orthogonal to the width direction Dw. The pair of wall parts 56b protrude from upper and lower ends of the base part 56a in the width direction Dw. Each of the pair of wall parts 56b has a predetermined width in the width direction Dw and is continuous in the forward and rearward direction Da. Due to the base part 56a and the pair of wall parts 56b, the cross-sectional shape of the protrusion member 56 has a C shape when seen in the forward and rearward direction Da.

The claw part 56c is continuous from each of the pair of wall parts 56b and protrudes toward one side in the forward and rearward directions Da. A tip end portion of each of the claw parts 56c forms the square protrusion 52A. The claw part 56c (the square protrusion 52A) can advance and retract from the end plate 42t in the forward and rearward direction Da through a slit 42s formed in the end plate 42t.

The spring insertion part 56d protrudes in the forward and rearward direction Da from a second end portion of the base part 56a in the forward and rearward direction Da. The spring insertion part 56d is inserted inside the biasing spring 58 which will be described later.

The stopper part 56e protrudes in the width direction Dw from a first end portion of the base part 56a in the forward and rearward direction Da. The stopper part 56e restricts a protrusion dimension of the claw part 56c (the square protrusion 52A) in the forward and rearward direction Da by coming into contact with the end plate 42t.

The holding bracket 57 is fixed to the outer rail 42 of the rail main body 41. The holding bracket 57 integrally has a base part 57a, a pair of guide parts 57b, and an end wall part 57c. The holding bracket 57 is formed by bending a metal plate into a predetermined shape by press working.

The base part 57a has a plate shape and is provided in a plane orthogonal to the width direction Dw. The pair of guide parts 57b are provided on both sides of the base part 57a in the vertical direction Dv. Each of the guide parts 57b is continuous in the forward and rearward direction Da and guides the protrusion member 56 to be movable in the forward and rearward direction Da. The end wall part 57c is provided at a second end portion of the base part 57a in the forward and rearward direction Da. The end wall part 57c is provided in a plane orthogonal to the forward and rearward direction Da.

The biasing spring 58 is made of, for example, a coil spring. The biasing spring 58 is provided in a compressed state between the end wall part 57c of the holding bracket 57 and the base part 56a of the protrusion member 56. Thus, the biasing spring 58 biases the claw part 56c (the square protrusion 52A) of the protrusion member 56 in a direction in which it protrudes from the first end portion 41a of the rail main body 41 (the end plate 42t of the outer rail 42).

The square protrusion 52A is biased by the biasing spring 58 and protrudes from the end plate 42t in the forward and rearward direction Da in a state in which the stopper part 56e comes into contact with the end plate 42t of the outer rail 42. Further, when the square protrusion 52A is pressed toward the end plate 42t side against a biasing force of the biasing spring 58 by an external force, the square protrusion 52A is pressed in a direction in which the protrusion dimension from the end plate 42t becomes smaller.

As shown in FIG. 9, the rail main body 41 includes a second fixing part 50B at the second end portion 41b on the other side in the forward and rearward direction Da. The second fixing part 50B is provided on the end plate 43t of the inner rail 43. The second fixing part 50B includes a round protrusion (a first protrusion) 51B, a square protrusion (a second protrusion) 52B, an advancement and retraction mechanism 53B (refer to FIG. 10), a screw hole 54B, and a temporary locking claw (a third protrusion) 55. The round protrusion 51B, the square protrusion 52B, the advancement and retraction mechanism 53B, and the screw hole 54B are basically the same as the round protrusion 51A, the square protrusion 52A, the advancement and retraction mechanism 53A, and the screw hole 54A of the first fixing part 50A. Therefore, in the following, explanation will focus on parts in which the configuration of the round protrusion 51B, the square protrusion 52B, the advancement and retraction mechanism 53B, and the screw hole 54B is different from that of the round protrusion 51A, the square protrusion 52A, the advancement and retraction mechanism 53A, and the screw hole 54A of the first fixing part 50A.

Like the round protrusion 51A, the round protrusion 51B has a circular shape when seen in the forward and rearward direction Da and protrudes in a direction orthogonal to the end plate 43t.

Like the square protrusion 52A, the square protrusion 52B has a rectangular shape having a long side in the width direction Dw when seen in the forward and rearward direction Da. The width dimension L2 of the square protrusion 52B is larger than a diameter L1 of the round protrusion 51B in the direction orthogonal to the forward and rearward direction Da. The square protrusion 52A and the square protrusion 52B, and the round protrusion 51A and the round protrusion 51B are formed to have the same dimensions.

The screw hole 54B is formed to pass through the end plate 43t of the inner rail 43 in the forward and rearward direction Da. The screw hole 54B has a female screw groove formed in an inner circumferential surface thereof.

As shown in FIG. 10, the advancement and retraction mechanism 53B causes the square protrusion 52B to advance and retract from the second end portion 41b of the rail main body 41. Like the advancement and retraction mechanism 53A, the advancement and retraction mechanism 53B includes the protrusion member 56, the holding bracket 57, and the biasing spring 58.

As shown in FIG. 9, a temporary locking claw 55 protrudes from the end plate 43t of the inner rail 43 in the forward and rearward direction Da. The temporary locking claw 55 has a plate shape and is located in a plane orthogonal to the width direction Dw. About the temporary locking claw 55, cutout parts 55c recessed in the vertical direction Dv are formed above and below a claw base part 55a on the end plate 43t side. A tip end portion 55s of the temporary locking claw 55 has a height dimension L3 in the vertical direction Dv which is equal to or less than the diameter L1 of the round protrusion 51B.

The temporary locking claw 55 is provided between a pair of square protrusions 52B provided at an interval in the vertical direction Dv.

Such an inner rail 43 is formed by bending a metal plate into a predetermined shape by press working.

Next, an attachment structure of the rack rail 40 to the rack strut 32 will be described.

The rack rail 40 can be attached to two different types of strut members 34X and 34Y. As shown in FIG. 7, each of the strut members 34X and 34Y constitutes the rack strut 32 of the server rack 30.

Figure 11:
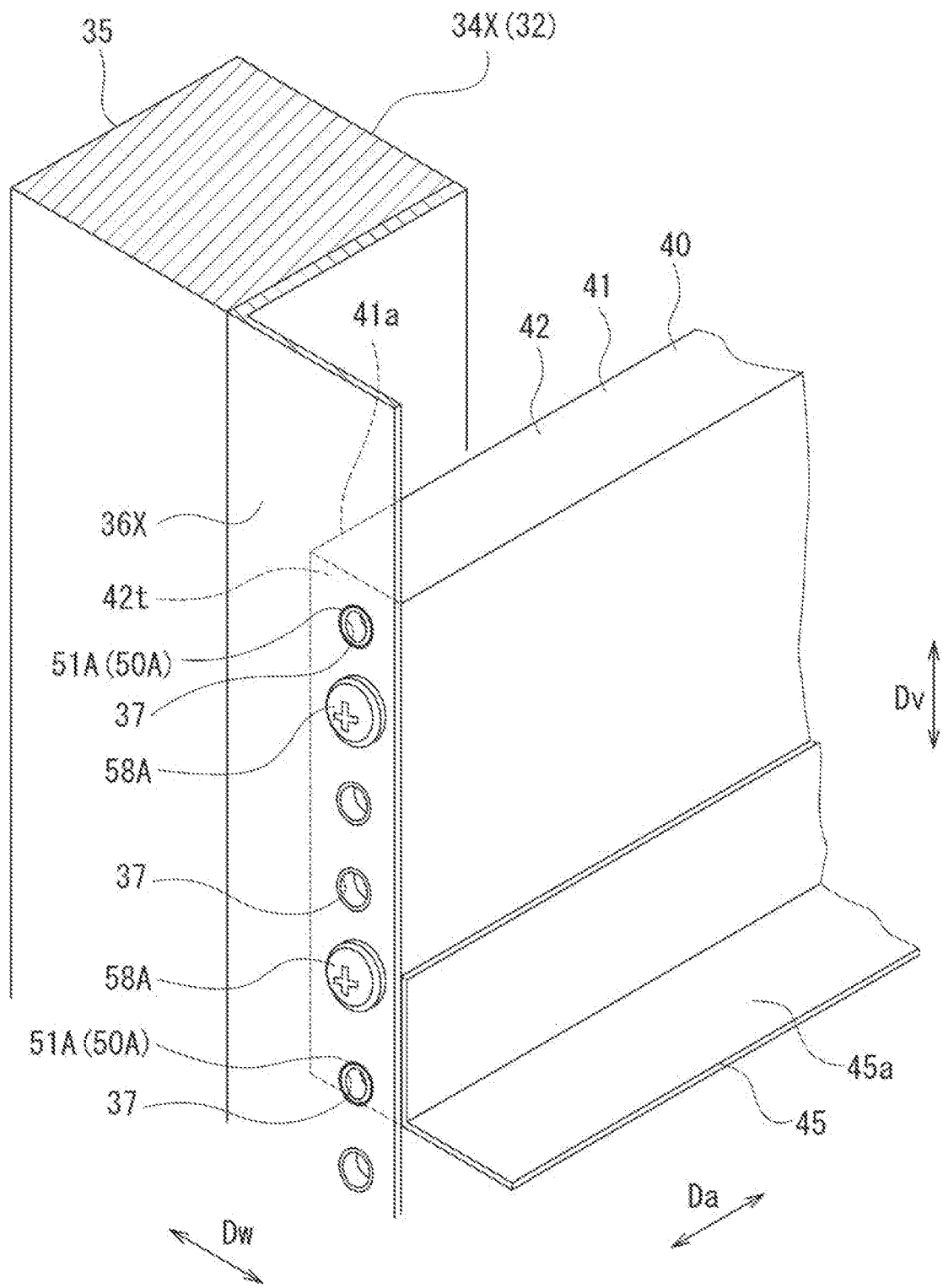
FIG. 11 is a perspective view showing an attachment structure of the first end portion of a rack rail on a strut member as the first target member according to the present embodiment.
Figure 12:
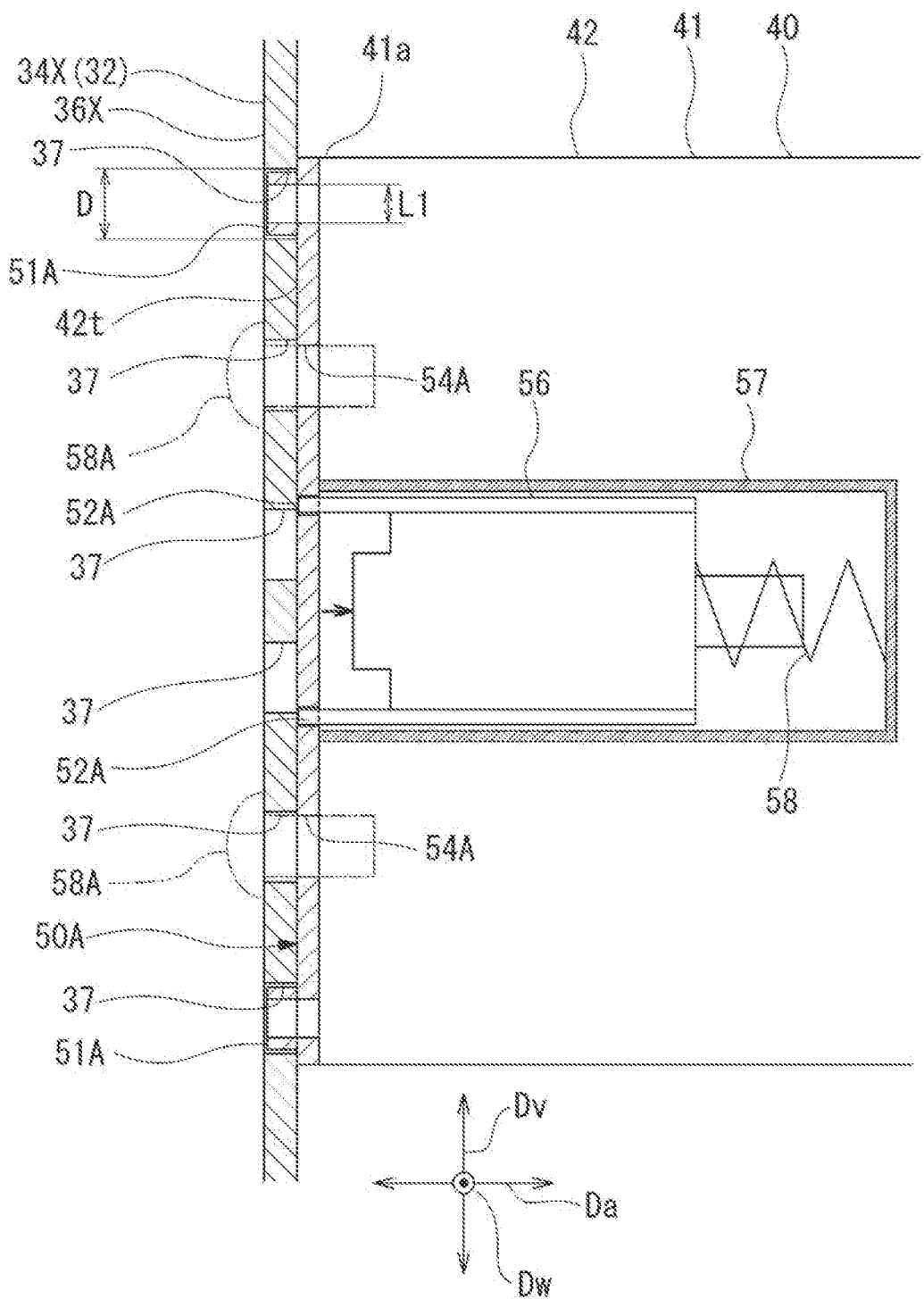
FIG. 12 is a side cross-sectional view showing the attachment structure of the first end portion of the rack rail on the strut member as the first target member according to the present embodiment.
Figure 13:
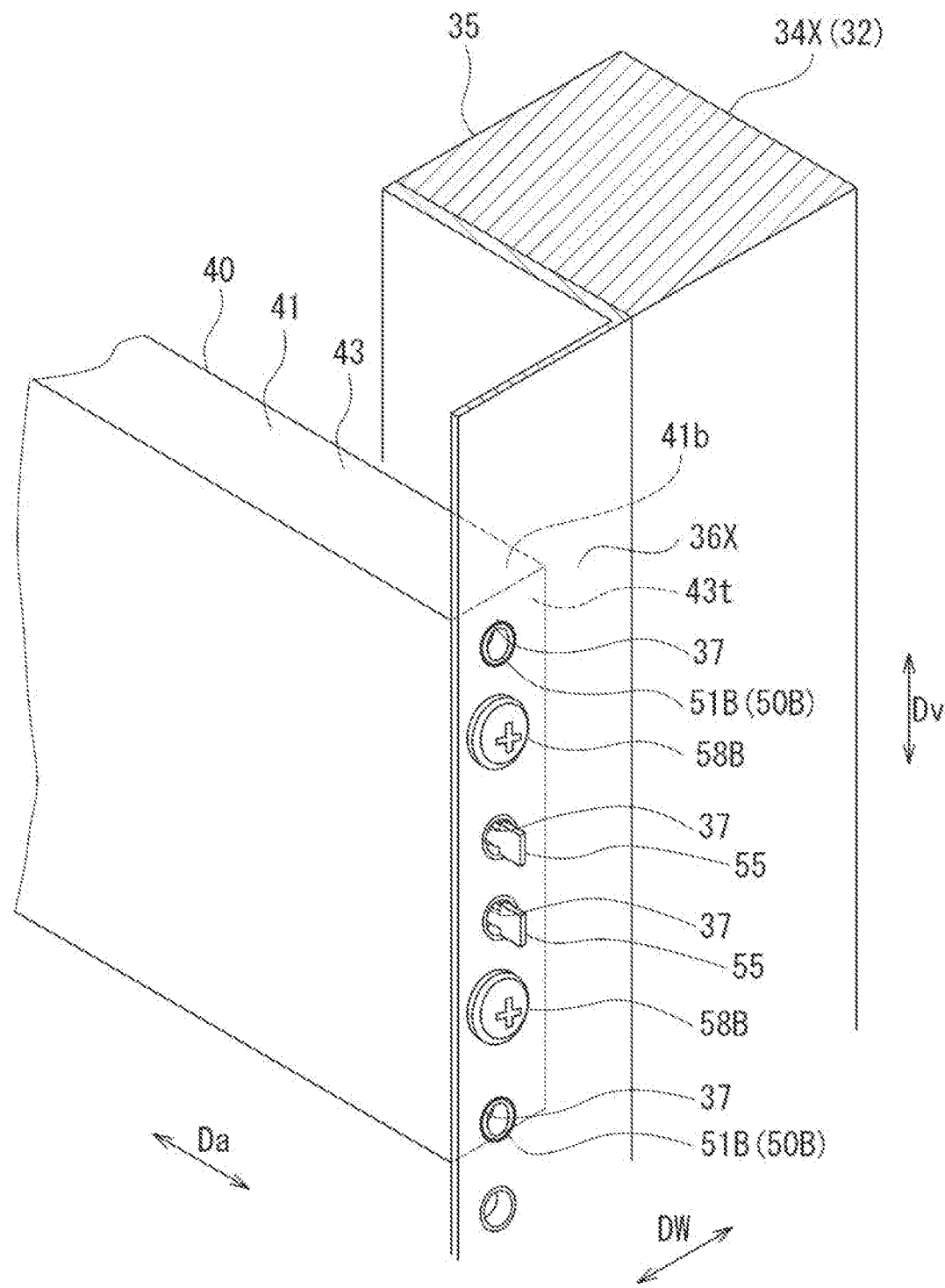
FIG. 13 is a perspective view showing an attachment structure of the second end portion of the rack rail on a strut member as the first target member according to the present embodiment.
Figure 14:
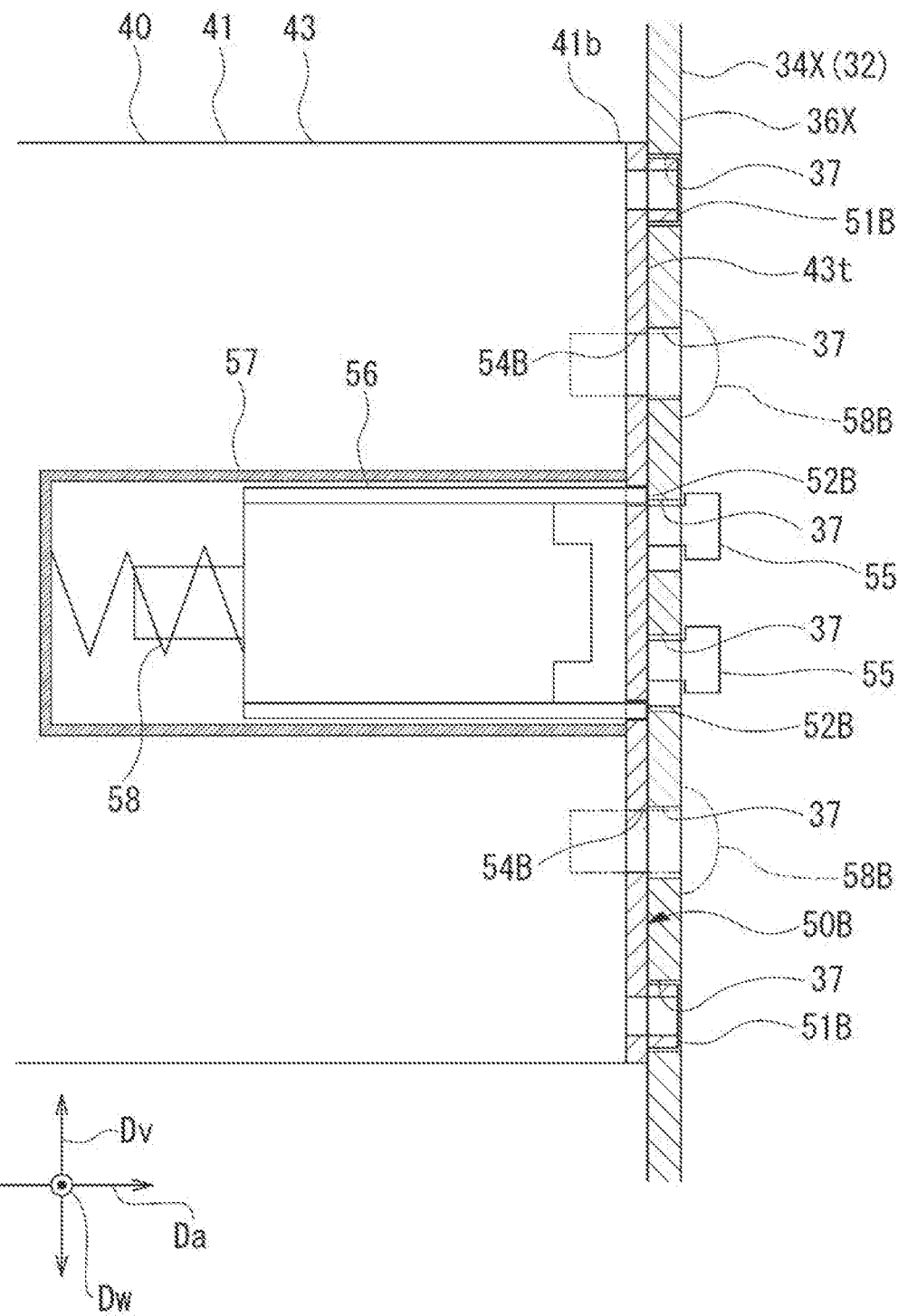
FIG. 14 is a side cross-sectional view showing the attachment structure of the second end portion of the rack rail on the strut member as the first target member according to the present embodiment.

FIG. 11 is a perspective view showing an attachment structure of the first end portion of a rack rail on a strut member as the first target member according to the present embodiment. FIG. 12 is a side cross-sectional view showing the attachment structure of the first end portion of the rack rail on the strut member as the first target member according to the present embodiment. FIG. 13 is a perspective view showing an attachment structure of the second end portion of the rack rail on the strut member as the first target member according to the present embodiment. FIG. 14 is a side cross-sectional view showing the attachment structure of the second end portion of the rack rail on the strut member as the first target member according to the present embodiment.

As shown in FIGS. 11 to 14, the strut member (the target member, the first target member) 34X includes a strut main body 35 (refer to FIGS. 11 and 13) and an attachment bracket 36X. The strut main body 35 extends in the vertical direction Dv and has a required strength as the rack strut 32. The attachment bracket 36X is fixed to a side surface of the strut main body 35. The attachment bracket 36X protrudes from the strut main body 35 to the inside of the server rack 30 in the width direction Dw.

The attachment bracket 36X has a plurality of locking holes (the first engaged part, the engaged part) 37 at predetermined intervals in the vertical direction. The locking hole 37 has a circular shape when seen in the forward and rearward direction Da.

The locking hole 37 passes through the attachment bracket 36X in the forward and rearward direction Da.

The round protrusions 51A and 51B of the rack rail 40 can be engaged with the locking hole 37. That is, an inner diameter D of the locking hole 37 is larger than the diameter L1 of the round protrusions 51A and 51B. Further, the inner diameter D of the locking hole 37 is smaller than the width dimension L2 (refer to FIGS. 8 and 9) of the square protrusions 52A and 52B. That is, the square protrusions 52A and 52B cannot be engaged with the locking hole 37.

Figure 15:
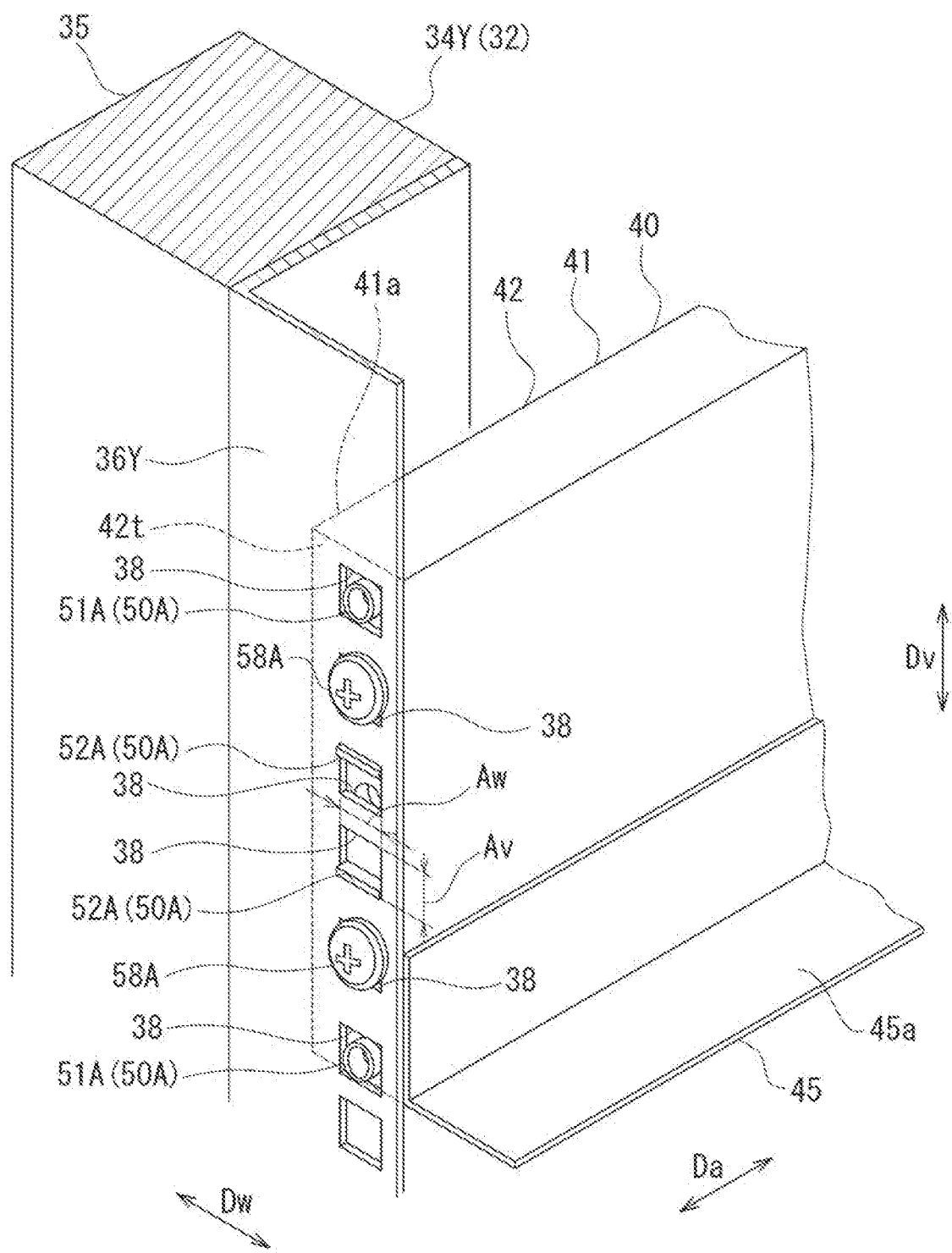
FIG. 15 is a perspective view showing an attachment structure of the first end portion of a rack rail on a strut member as the second target member according to the present embodiment.
Figure 16:
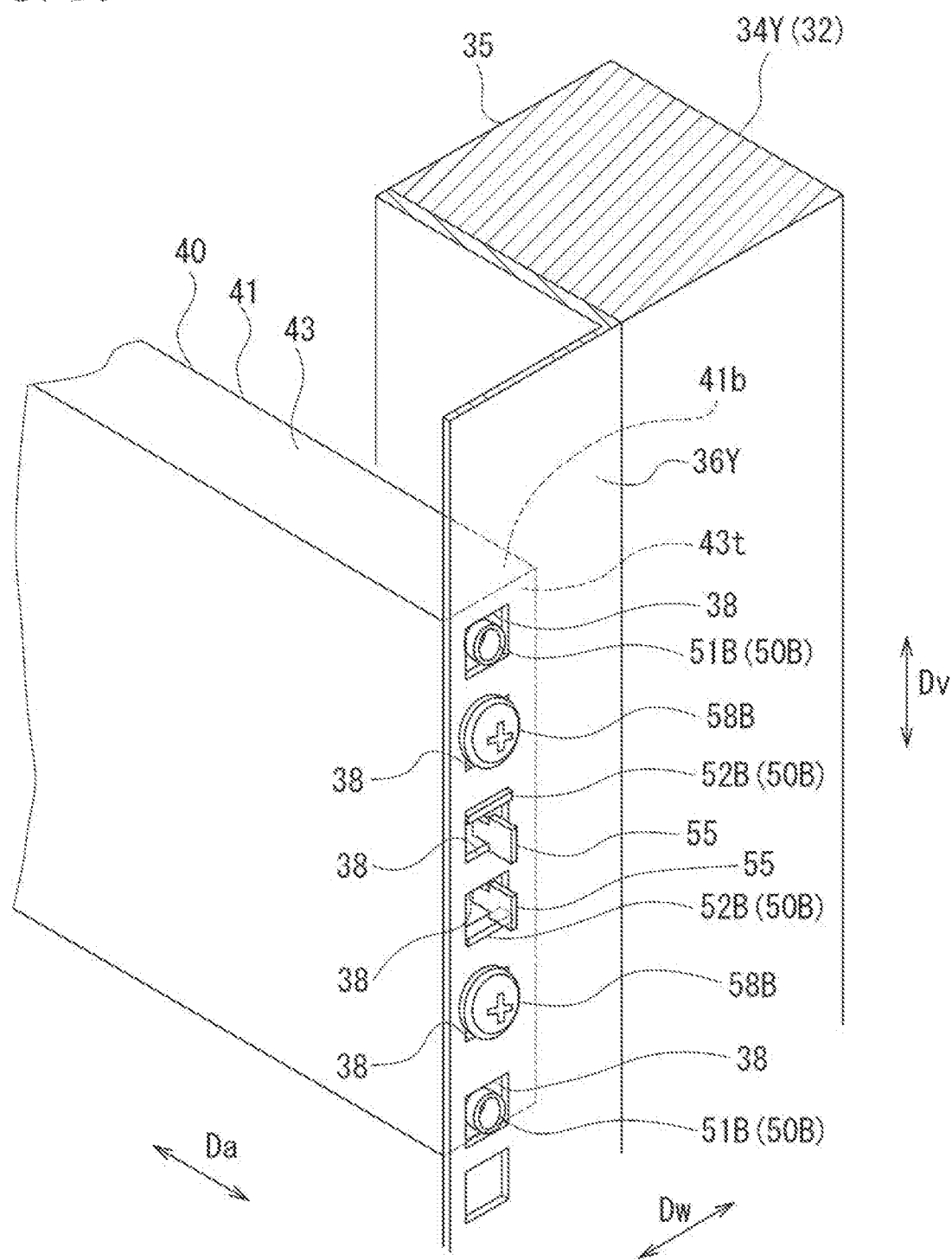
FIG. 16 is a perspective view showing an attachment structure of the second end portion of a rack rail on a strut member as the second target member according to the present embodiment.

FIG. 15 is a perspective view showing an attachment structure of the first end portion of the rack rail on the strut member as the second target member according to the present embodiment. FIG. 16 is a perspective view showing an attachment structure of the second end portion of the rack rail on the strut member as the second target member according to the present embodiment.

As shown in FIGS. 15 and 16, the strut member (the target member, the second target member) 34Y includes the strut main body 35 and an attachment bracket 36Y The strut main body 35 extends in the vertical direction Dv and has a required strength as the rack strut 32. The attachment bracket 36Y is fixed to the side surface of the strut main body 35. The attachment bracket 36Y protrudes from the strut main body 35 to the inside of the server rack 30 in the width direction Dw.

The attachment bracket 36Y has a plurality of locking holes (the second engaged parts) 38 at predetermined intervals in the vertical direction. The locking hole 38 has a square shape when seen in the forward and rearward direction Da. The locking hole 38 passes through the attachment bracket 36Y in the forward and rearward direction Da.

The square protrusions 52A and 52B of the rack rail 40 can be engaged with the locking hole 38. That is, the locking holes 38 have opening dimensions Av and Aw in the vertical direction Dv and the width direction Dw larger than the width dimensions L2 (refer to FIGS. 8 and 9) of the square protrusions 52A and 52B. Therefore, the round protrusions 51A and 51B having the diameter L1 smaller than the square protrusions 52A and 52B can also be engaged with the locking hole 38.

The strut members 34X and 34Y as described above are appropriately selected and incorporated into the server rack 30. However, in each of the server racks 30, all rack struts 32 incorporate the same type of strut member 34X or strut member 34Y.

First, a case in which the rack rail 40 is attached to the strut member 34X having the circular locking hole 37 will be described.

As shown in FIGS. 11 and 12, the round protrusion 51A is engaged with the locking hole 37 at the first end portion 41a of the rail main body 41. Thus, the movement of the first end portion 41a of the rail main body 41 in the width direction Dw and the vertical direction Dv is restricted.

The square protrusion 52A is pressed against the biasing force of the biasing spring 58 of the advancement and retraction mechanism 53A by coming into contact with the attachment bracket 36X of the rack strut 32 and is retracted inside the first end portion 41a of the rail main body 41. Thus, the end plate 42t of the first end portion 41a of the rail main body 41 comes into contact with the attachment bracket 36X of the rack strut 32 around the square protrusion 52A.

Further, a bolt 58A is fastened to the screw hole 54A through the locking hole 37. In this way, a first end portion of the rack rail 40 in the forward and rearward direction Da is attached to the strut member 34X.

As shown in FIGS. 13 and 14, the round protrusion 51B is engaged with the locking hole 37 at the second end portion 41b of the rail main body 41. Therefore, the movement of the second end portion 41b of the rail main body 41 is restricted in the width direction Dw and the vertical direction Dv.

The square protrusion 52B is pressed against the biasing force of the biasing spring 58 of the advancement and retraction mechanism 53B by coming into contact with the attachment bracket 36X of the rack strut 32, and is retracted inside the second end portion 41b of the rail main body 41. Thus, the end plate 43t of the second end portion 41b of the rail main body 41 comes into contact with the attachment bracket 36X of the rack strut 32 around the square protrusion 52B. Further, the temporary locking claw 55 is inserted into another locking hole 37 different from the locking hole 37 with which the round protrusion 51B is engaged. Further, the bolt 58B is fastened to the screw hole 54B through the locking hole 37. In this way, a second end portion of the rack rail 40 in the forward and rearward direction Da is attached to the strut member 34X.

Next, a case in which the rack rail 40 is attached to the strut member 34Y having the rectangular locking hole 38 will be described.

As shown in FIG. 15, the square protrusion 52A is engaged with the locking hole 38 at the first end portion 41a of the rail main body 41. The upper square protrusion 52A is inserted into the upper side of the locking hole 38. The lower square protrusion 52A is inserted into the lower side of the lower locking hole 38. Thus, the movement of the first end portion 41a of the rail main body 41 in the width direction Dw and the vertical direction Dv is restricted.

The round protrusion 51A is inserted into another locking hole 38 different from the locking hole 38 with which the square protrusion 52A is engaged. Thus, the end plate 42t of the first end portion 41a of the rail main body 41 comes into contact with the attachment bracket 36Y of the rack strut 32.

Further, the bolt 58A is fastened to the screw hole 54A through the locking hole 38. In this way, the second end portion of the rack rail 40 in the forward and rearward direction Da is attached to the strut member 34Y As shown in FIG. 16, the square protrusion 52B is engaged with the locking hole 38 at the second end portion 41b of the rail main body 41. The upper square protrusion 52B is inserted into the upper side of the locking hole 38. The lower square protrusion 52B is inserted into the lower side of the lower locking hole 38. As a result, the movement of the second end portion 41b of the rail main body 41 in the width direction Dw and the vertical direction Dv is restricted.

The round protrusion 51B is inserted into another locking hole 38 different from the locking hole 38 with which the square protrusion 52B is engaged. Thus, the end plate 43t of the second end portion 41b of the rail main body 41 comes into contact with the attachment bracket 36Y of the rack strut 32. Further, the temporary locking claw 55 is inserted into the locking hole 38 with which the square protrusion 52B is engaged.

Further, the bolt 58B is fastened to the screw hole 54B through the locking hole 38. In this way, the second end portion of the rack rail 40 in the forward and rearward direction Da is attached to the strut member 34Y.

In this way, the round protrusions 51A and 51B, and the square protrusions 52A and 52B which protrude from the first end portion 41a and the second end portion 41b of the rail main body 41 by the advancement and retraction mechanisms 53A and 53B are engaged with the strut member 34Y having the rectangular locking hole 38.

Next, an attachment method of the rack rail 40 to the strut member 34X will be described.

Figure 17:
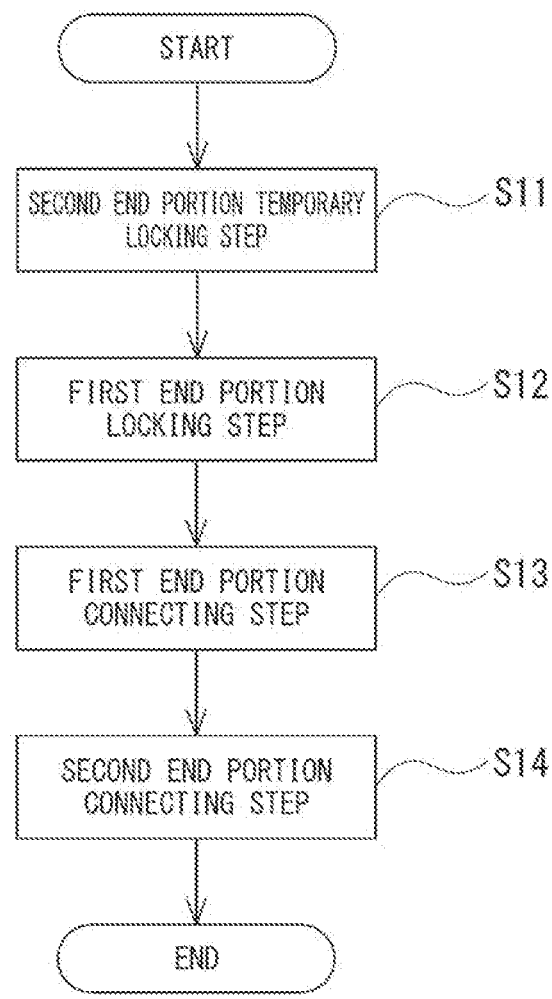
FIG. 17 is a diagram showing a process flow of a member attachment method according to the present embodiment.

FIG. 17 is a diagram showing a process flow of a member attachment method according to the present embodiment. FIG. 18 is a side cross-sectional view showing a state in which the second end portion of the rack rail is temporarily locked in the member attachment method according to the present embodiment.

As shown in FIG. 17, the attachment method of the rack rail 40 includes a second end portion temporary locking step (an engagement step) S11, a first end portion locking step (an engagement step) S12, a first end portion connecting step (a connection step) S13, and a second end portion connection step (a connection process) S14.

In the second end portion temporary locking step S11, the second end portion of the rack rail 40 in the forward and rearward direction Da is temporarily locked to the strut member 34X. For this purpose, as shown in FIG. 18, a pair of temporary locking claws 55 provided at the second end portion 41b of the rail main body 41 are inserted into two locking holes 37 of the strut member 34X. In each of the temporary locking claws 55, an inner circumferential edge of the locking hole 37 is engaged with the cutout part 55c by causing the tip end portion 55s to protrude through the locking hole 37 to the opposite side of the mounting bracket 36X. Thus, the temporary locking claw 55 is less likely to accidentally fall out of the locking hole 37.

Further, the round protrusion 51B of the second end portion 41b of the rail main body 41 is engaged with the locking hole 37 at a predetermined position. At this time, the square protrusion 52B comes into contact with the attachment bracket 36X of the rack strut 32 when the round protrusion 51B is inserted into the locking hole 37. Thus, the square protrusion 52B is pressed against the biasing force of the biasing spring 58 of the advancement and retraction mechanism 53B and is retracted inside the second end portion 41b of the rail main body 41. As a result, the second end portion 41b (the end plate 43t) of the rail main body 41 comes into contact with the attachment bracket 36X of the rack strut 32 around the square protrusion 52B.

At this time, in the rack rail 40, the inner rail 43 is received inside the outer rail 42, and a total length thereof in the forward and rearward direction Da is made shorter than an interval between the strut members 34X and 34X in the forward and rearward direction Da.

In the first end portion locking step S12, the first end portion of the rack rail 40 in the forward and rearward direction Da is locked to the strut member 34X. For this purpose, the outer rail 42 is slid to one side (the left side in FIG. 18) in the forward and rearward direction Da with respect to the inner rail 43 temporarily locked to the strut member 34X on the other side in the forward and rearward direction Da by the temporary locking claw 55. Thus, the length of the rack rail 40 in the forward and rearward direction Da increases. After that, as shown in FIGS. 11 and 12, the round protrusion 51A of the first end portion 41a of the rail main body 41 is engaged with the locking hole 37 at a predetermined position. At this time, the square protrusion 52A comes into contact with the attachment bracket 36X of the rack strut 32 when the round protrusion 51A is inserted into the locking hole 37. Thus, the square protrusion 52A is pressed against the biasing force of the biasing spring 58 of the advancement and retraction mechanism 53A and is retracted inside the first end portion 41a of the rail main body 41. Thus, the end plate 42t of the first end portion 41a of the rail main body 41 comes into contact with the attachment bracket 36X of the rack strut 32 around the square protrusion 52A.

In the first end portion connecting step S13, the first end portion 41a of the rail main body 41 and the strut member 34X are connected. For this purpose, the bolt 58A is fastened to the screw hole 54A through the locking hole 37. Thus, the first end portion of the rack rail 40 in the forward and rearward direction Da is attached to the strut member 34X.

In the second end connection step S14, the second end portion 41b of the rail main body 41 and the strut member 34X are connected. For this purpose, the bolt 58B is fastened to the screw hole 54B through the locking hole 37. Thus, the second end portion of the rack rail 40 in the forward and rearward direction Da is attached to the strut member 34X.

Next, an attachment method of the rack rail 40 to the strut member 34Y will be described.

First, as shown in FIG. 16, the second end portion of the rack rail 40 in the forward and rearward direction Da is temporarily locked to the strut member 34Y. For this purpose, a pair of temporary locking claws 55 provided at the second end portion 41b of the rail main body 41 are inserted into the two locking holes 38 of the strut member 34Y.

Further, the round protrusion 51B of the second end portion 41b of the rail main body 41 is engaged with the locking hole 38 at a predetermined position. At this time, the square protrusion 52B is also inserted into another locking hole 38 different from the locking hole 38 with which the round protrusion 51B is engaged.

Next, the first end portion of the rack rail 40 in the forward and rearward direction Da is locked to the strut member 34Y For this purpose, as shown in FIG. 15, the round protrusion 51A of the first end portion 41a of the rail main body 41 is engaged with the locking hole 38 at a predetermined position. At this time, the square protrusion 52A is also inserted into another locking hole 38 different from the locking hole 38 with which the round protrusion 51A is engaged.

After that, the bolt 58A is fastened to the screw hole 54A through the locking hole 38. Thus, the first end portion of the rack rail 40 in the forward and rearward direction Da is attached to the strut member 34Y Then, as shown in FIG. 16, the bolt 58B is fastened to the screw hole 54B through the locking hole 38 at the second end portion 41b of the rail main body 41. Thus, the second end portion of the rack rail 40 in the forward and rearward direction Da is attached to the strut member 34Y.

In such a rack rail 40 and attachment structure of the rack rail 40, when the rack rail 40 is attached to the strut member 34X, the round protrusions 51A and 51B are engaged with the locking holes 37. In a state in which the round protrusions 51A and 51B are engaged with the locking holes 37 and the rack rail 40 is attached to the strut member 34X, the square protrusions 52A and 52B are retracted inside the first end portion 41a and the second end portion 41b by the advancement and retraction mechanisms 53A and 53B. Thus, it is possible to curb the interference between the square protrusions 52A and 52B and the strut member 34X. Therefore, when the round protrusions 51A and 51B are engaged with the locking holes 37 and the rack rail 40 is attached to the strut member 34X, it is possible to curb the formation of a gap between the first end portion 41a and the second end portion 41b of the rail main body 41 and the strut member 34X. As a result, the first end portion 41a and the second end portion 41b of the rail main body 41 and the strut member 34X can be brought into close contact with each other to increase the strength of attachment of the rack rail 40 to the rack strut 32.

Further, when the rack rail 40 is attached to the strut member 34Y, the square protrusions 52A and 52B are engaged with the locking holes 38. Furthermore, the round protrusions 51A and 51B are engaged with the locking holes 38 different from the locking holes 38 with which the square protrusions 52A and 52B are engaged. In this way, the rack rail 40 can be attached to different types of strut members 34X and 34Y, and is highly versatile.

Further, the round protrusions 51A and 51B have smaller external dimensions in a direction orthogonal to the direction connecting the first end portion 41a and the second end portion 41b of the rail main body 41 than that of the square protrusions 52A and 52B. Thus, the round protrusions 51A and 51B can be easily distinguished from the square protrusions 52A and 52B, and erroneous assembly can be prevented.

Further, the round protrusions 51A and 51B and the square protrusions 52A and 52B have different shapes when seen in the forward and rearward direction Da. Thus, the round protrusions 51A and 51B can be easily distinguished from the square protrusions 52A and 52B, and erroneous assembly can be prevented.

Further, a plurality of sets of round protrusions 51A and 51B and a plurality of sets of square protrusions 52A and 52B are provided. For example, the plurality of sets of round protrusions 51A and 51B and the plurality of sets of square protrusions 52A and 52B are provided in the vertical direction Dv. Thus, it is possible to curb rotation of the rack rail 40 around an axis extending in the forward and rearward direction Da in a state where the rack rail 40 is attached to the strut members 34X and 34Y. Therefore, the rack rail 40 can be attached stably and firmly.

Further, the temporary locking claw 55 is provided at the second end portion 41b of the rail main body 41. Thus, when the rack rail 40 is attached, the first end portion 41a side can be locked and connected in a state in which the second end portion 41b of the rail main body 41 is temporarily locked to the strut members 34X and 34Y by the temporary locking claw 55. Thus, the rack rail 40 can be attached by one person, and workability is improved.

Further, in the advancement and retraction mechanisms 53A and 53B, the protrusion members 56 forming the square protrusions 52A and 52B are biased by the biasing spring 58. Thus, when the square protrusions 52A and 52B are pressed against the strut members 34X and 34Y, the square protrusions 52A and 52B are pushed in and retracted inside the first end portion 41a and the second end portion 41b. Therefore, an operation of retracting the square protrusions 52A and 52B becomes unnecessary, and attachment workability of the rack rail 40 is improved.

In such an attachment method of the rack rail 40, in a state in which the round protrusions 51A and 51B are engaged with the locking holes 37, and the rack rail 40 is attached to the rack strut 32, the square protrusions 52A and 52B do not protrude from the first end portion 41a and the second end portion 41b, but are retracted inside the first end portion 41a and the second end portion 41b. Thus, it is possible to curb the interference of the square protrusions 52A and 52B with the rack strut 32. Therefore, it is possible to curb the formation of a gap between the first end portion 41a and the second end portion 41b of the rail main body 41 and the rack strut 32. As a result, the first end portion 41a and the second end portion 41b of the rail main body 41 and the rack strut 32 can be brought into close contact with each other to increase the strength of attachment of the rack rail 40 to the rack strut 32.

In the above-described embodiment, the round protrusions 51A and 51B, the square protrusions 52A and 52B, and the locking holes 37 and 38 have been described, but the shape, arrangement, number of installations, and the like thereof are not limited at all. The round protrusions 51A and 51B and the locking holes 37 and 38, and the square protrusions 52A and 52B and the locking holes 37 and 38 may be respectively engaged with each other.

In the above-described embodiment, the advancement and retraction mechanisms 53A and 53B are not limited in specific configuration thereof as long as the square protrusions 52A and 52B can advance and retract from the first end portion 41a and the second end portion 41b. For example, although the biasing spring 58 is provided, the biasing spring 58 may not be provided, and the square protrusions 52A and 52B may advance and retract from the first end portion 41a and the second end portion 41b by, for example, a screw mechanism or the like.

Further, in the above-described embodiment, the square protrusions 52A and 52B are made to advance and retract by the advancement and retraction mechanisms 53A and 53B, but the round protrusions 51A and 51B may also include the same advancement and retraction mechanism.

Further, although the temporary locking claw 55 is provided only on the second end portion 41b of the rail main body 41, it may be provided on the first end portion 41a of the rail main body 41 as well.

Additionally, as long as the gist of the present invention is not deviated, the configurations described in the above-described embodiments can be selected or changed to other configurations as appropriate.

This application claims priority on the basis of Japanese Patent Application No. 2018-208863 filed in Japan on Nov. 6, 2018, and incorporates all of its disclosures herein.

INDUSTRIAL APPLICABILITY

According to the attachment member, the member attachment structure, and the member attachment method of the present invention, it is possible to curb lowering of the strength of attachment of a member to a target member.

REFERENCE SIGNS LIST

1 Attachment member
2, 12, 22 Member main body
2a, 12a, 22a End portion
3, 13, 23 First protrusion
4, 14, 24 Second protrusion
5, 15 Advancement and retraction mechanism
11, 21 Member
34X Strut member (target member, first target member)
34Y Strut member (target member, second target member)
37 Locking hole (first engaged part, engaged part)
38 Locking hole (second engaged part)
40 Rack rail (attachment member, member)
41 Rail main body (member main body)
41a First end portion (end portion)
41b Second end portion (end portion)
51A, 51B Round protrusion (first protrusion)
52A, 52B Square protrusion (second protrusion)
53A, 53B Advancement and retraction mechanism
55 Temporary locking claw (third protrusion)
56 Protrusion member
57 Holding bracket (holding member)
58 Biasing spring (holding member)
101 First target member
101a First engaged part
102 Second target member
102a Second engaged part
111, 121 Target member
111a, 121a Engaged part
L1 Diameter (external dimension)
L2 Width dimension (external dimension)
S1 Engagement step
S2 Connection step
S11 Second end portion temporary locking step (engagement step)
S12 First end portion locking step (engagement step)
S13 First end portion connecting step (connection step)
S14 Second end portion connecting step (connection step)

What is claimed is:

1. An attachment member which is attachable to target members of different types, the attachment member comprising:
    a member main body;
    a first protrusion which is provided on an end portion of the member main body and is engageable with a first engaged part formed on a first target member;
    a second protrusion which is provided on the end portion of the member main body and is engageable with a second engaged part formed on a second target member;
    an advancement and retraction mechanism which is configured to cause the second protrusion to advance and retract from the end portion of the member main body; and
    a third protrusion which is provided on the end portion of the member main body, and protrudes from the end portion of the member main body,
    wherein the end portion of the member main body has a long shape in one direction, and
    the third protrusion has a claw base part and a cutout part, the cutout part being recessed in the one direction and being engageable with an inner circumferential edge of a locking hole of the target members.

2. The attachment member according to claim 1, wherein, when the member main body is attached to the first target member,
    the first protrusion is engaged with the first engaged part, and the second protrusion is retracted inside the end portion of the member main body by the advancement and retraction mechanism, and the end portion of the member main body around the second protrusion comes into contact with the first target member.

3. The attachment member according to claim 1, wherein, when the member main body is attached to the second target member,
    the second protrusion is engaged with the second engaged part, and the first protrusion is inserted into another second engaged part different from the second engaged part with which the second protrusion is engaged.

4. The attachment member according to claim 3, wherein an external dimension of the first protrusion in a direction orthogonal to a direction which connects a first end portion and a second end portion of the member main body is smaller than that of the second protrusion.

5. The attachment member according to claim 1, wherein the first protrusion and the second protrusion have different shapes when seen in a direction in which a first end portion is connected to a second end portion of the member main body.

6. The attachment member according to claim 1, wherein a plurality of sets of the first protrusion and the second protrusion are provided.

7. The attachment member according to claim 1, wherein, the first protrusion, the second protrusion, and the advancement and retraction mechanism are provided at both end portions of the member main body, and the third protrusion is provided at least at first end portion of the member main body, and protrudes from the end portion of the member main body.

8. The attachment member according to claim 1, wherein, the advancement and retraction mechanism comprises:
    a protrusion member which forms the second protrusion;
    a holding member which holds the protrusion member to be advanceable and retractable from the end portion of the member main body; and
    a biasing member which is configured to bias the protrusion member in a direction of protruding from the end portion of the member main body.

9. A member attachment structure to a member that is target,
    wherein the member comprises:
    a member main body;
    a first protrusion which is provided at an end portion of the member main body;
    a second protrusion which is provided at the end portion of the member main body; and
    an advancement and retraction mechanism which is configured to cause the second protrusion to advance and retract from the end portion of the member main body, and
    wherein the first protrusion is engaged with an engaged part formed on the member that is target, the second protrusion is retracted inside the end portion of the member main body by the advancement and retraction mechanism, and the end portion of the member main body around the second protrusion is brought into contact with the member that is target, wherein the member further comprises a third protrusion which is provided on the end portion of the member main body, and protrudes from the end portion of the member main body, wherein the end portion of the member main body has a long shape in one direction, and the third protrusion has a claw base part and a cutout part, the cutout part being recessed in the one direction and being engageable with an inner circumferential edge of a locking hole of the member that is target.

10. A member attachment method to a target member, the member attachment method comprising:

engaging a first protrusion provided at an end portion of a member main body of a member with an engaged part formed on the target member, causing a second protrusion provided to be advanceable and retractable from the end portion of the member main body to retract inside the end portion, and bringing the end portion of the member main body around the second protrusion into contact with the target member; and connecting the end portion of the member main body to the target member, wherein, in the engaging, a cutout part of a third protrusion is engageable with an inner circumferential edge of a locking hole of the target member, the third protrusion having the cutout part recessed in one direction and a claw base part, the third protrusion being provided on the end portion of the member main body and protruding from the end portion of the member main body.

* * * * *